US012583360B2

(12) United States Patent
Koch et al.

(10) Patent No.: US 12,583,360 B2
(45) Date of Patent: Mar. 24, 2026

(54) ELECTRODE BASED CHARGING CONTROL FOR VEHICLE BATTERY

(71) Applicant: GM GLOBAL TECHNOLOGY OPERATIONS LLC, Detroit, MI (US)

(72) Inventors: Brian J. Koch, Berkley, MI (US); Jing Gao, Rochester, MI (US); Xi Chen, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 285 days.

(21) Appl. No.: 18/352,451

(22) Filed: Jul. 14, 2023

(65) Prior Publication Data

US 2025/0018830 A1 Jan. 16, 2025

(51) Int. Cl.
| | |
|---|---|
| B60L 58/16 | (2019.01) |
| B60L 53/10 | (2019.01) |
| G01R 31/392 | (2019.01) |
| H01M 10/44 | (2006.01) |
| H01M 10/48 | (2006.01) |

(52) U.S. Cl.
CPC .............. B60L 58/16 (2019.02); B60L 53/11 (2019.02); G01R 31/392 (2019.01); H01M

*10/441* (2013.01); *H01M 10/482* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 10,700,376 B2 | 6/2020 | Koch | |
| 2019/0280345 A1* | 9/2019 | Spigno .................. | H01M 4/661 |
| 2021/0155114 A1* | 5/2021 | Chikkannanavar ... | B60L 3/0046 |
| 2022/0263117 A1* | 8/2022 | Hanchett ............. | H02J 7/00712 |

FOREIGN PATENT DOCUMENTS

DE 102018118429 A1 1/2019

* cited by examiner

*Primary Examiner* — Brian P Sweeney
*Assistant Examiner* — Jonathan E Reinert
(74) *Attorney, Agent, or Firm* — Quinn IP Law

(57) ABSTRACT

A method for controlling charging of a battery to minimize or avoid lithium plating. The method may include charging the battery during with a first charge current having a first charge profile, monitoring charging of the battery with the first charge current, and thereafter charging the battery with a second charge current having a cathode charge profile to prevent a cathode potential of the battery from exceeding a cathode threshold.

10 Claims, 5 Drawing Sheets

ELECTRODE BASED CHARGING CONTROL FOR VEHICLE BATTERY

INTRODUCTION

The present disclosure relates to minimizing or avoiding plating when charging batteries, such as but not necessarily limited to minimizing or avoiding lithium plating when fast charging lithium batteries of the type configured for powering electric motors used to propel a vehicle.

While the present disclosure is not limited to lithium, lithium-ion, or other lithium based batteries, lithium batteries may be considered as representative of a wide variety of batteries susceptible to plating, which in the case of lithium batteries may be referred to as lithium plating. As one skilled in the art may appreciate, the continued capacity of a lithium battery, particularly during a large number of repeated charge-discharge cycles, may depend in substantial measure on an effective movement of lithium into and out of the materials of opposing anode and cathode electrodes. During battery charging not all lithium entering host material may be accommodated to a suitable intercalated form (e.g., an $LiC6$ intercalation form for a host material comprising graphite) such that lithium plating may occur. The plating may result from lithium ions (e.g., Li+) depositing as metallic lithium when the conditions are such that lithium ion reduction is preferential to lithium intercalation. At high charging currents, such as those commonly used for charging batteries included within a vehicle, for example, the Li+ ion transport rate may exceed the rate at which Li+ ions may intercalate into the host material. This problem may be particularly pronounced during fast charging at high current, charging at low ambient temperatures and slowed lithium ion movement, and regenerative breaking in vehicles. Because plated lithium metal may not function in the same manner as intercalated lithium, lithium plating may constrain performance and limit usefulness of the battery.

SUMMARY

One non-limiting aspect of the present disclosure relates to minimizing or avoiding plating when charging a battery, such as but not necessarily limited to minimizing or avoiding lithium plating when fast charging a lithium battery of the type configured for powering electric motors used to propel a vehicle. The contemplated plating prevention may be achieved by selectively adjusting charging currents to avoid exceeding undesirable voltage potentials that may lead to plating a cathode and/or an anode of the battery.

One non-limiting aspect of the present disclosure relates to method for minimizing or avoiding lithium plating when direct current (DC) fast charging a battery included in a vehicle. The method may include charging the battery during a first charging phase with a first charge current having a first charge profile and thereafter commencing a second charging phase for charging the battery with a second charge current having a cathode charge profile. The cathode charge profile may incrementally decay the second charge current to prevent a cathode potential of a cathode of the battery from exceeding a cathode threshold.

The method may include commencing a third charging phase for charging the battery with a third charge current having an anode charge profile. The anode charge profile may incrementally decay the third charge current to prevent an anode potential of an anode of the battery from exceeding an anode threshold.

The method may include commencing the second charging phase after the first charging phase and prior to the third charging phase.

The method may include the first charge profile consistently maintaining the first charge current in a non-decaying manner, the cathode charge profile incrementally decaying the second charge current at a first decaying rate, and the anode charge profile incrementing decaying the third charge current at a second decaying rate greater than the first decaying rate.

The method may include commencing the second charging phase after the first charging phase and after the third charging phase.

The method may include the first charge profile consistently maintaining the first charge current in a non-decaying manner, the anode charge profile incrementally decaying the second charge current at a first decaying rate, and the cathode charge profile incrementally decaying the third charge current at a second decaying rate greater than the first decaying rate.

The method may include monitoring the cathode potential and commencing the second charging phase in response to the cathode potential being within a predefined cathode range of the cathode threshold.

The method may include monitoring the anode potential and commencing the third charging phase in response to the anode potential being within a predefined anode range of the anode threshold.

The method may include monitoring a state of charge (SOC) of the battery and commencing the second charging phase in response to the SOC exceeding a cathode SOC threshold.

The method may include monitoring a state of charge (SOC) of the battery and commencing the third charging phase in response to the SOC exceeding an anode SOC threshold.

One non-limiting aspect of the present disclosure relates to a method for minimizing or avoiding lithium plating when direct current (DC) fast charging a battery included in a vehicle. The method may include charging the battery during a first charging phase with a first charge current having a first charge profile, monitoring a cathode potential of a cathode of the battery during the first charging phase, and in response to the cathode potential approaching a cathode threshold, commencing a second charging phase for charging the battery with a second charge current having a cathode charge profile. The cathode charge profile may include adjusting the second charge current relative to the first charge current to prevent the cathode potential from exceeding the cathode threshold.

The method may include the cathode charge profile decaying the second charge current according to a cathode step function, optionally with the cathode step function being defined relative to a voltage of the battery.

The method may include the cathode step function including a plurality of step downs defined relative to a plurality of voltage values used to measure the voltage, optionally with each step down incrementally decreasing the second charge current relative to each of the step downs defined relative to a greater one of the SOC values.

The method may include the first charge profile having a non-decaying configuration and the cathode charge profile having a decaying configuration.

One non-limiting aspect of the present disclosure relates to a system for minimizing or avoiding lithium plating when direct current (DC) fast charging a battery included in a vehicle. The system may include a battery monitor configured for monitoring a voltage of the battery and a battery charger. The battery charger may be configured for charging the battery during a first charging phase with a first charge current having a first charge profile and commencing a second charging phase for charging the battery with a second charge current having a cathode charge profile in response to the voltage surpassing a first voltage threshold. The cathode charge profile may include adjusting the second charge current relative to the first charge current to prevent a cathode potential of a cathode of the battery from exceeding a cathode threshold.

The battery charger may be configured for commencing a third charging phase for charging the battery with a third charge current having a combined cathode-anode charge profile in response to the voltage surpassing a second voltage threshold greater than the first voltage threshold. The combined cathode-anode charge profile may include decaying the third charge current relative to the second charge current to prevent the cathode potential from exceeding the cathode and to prevent an anode potential of an anode of the battery from exceeding an anode charge threshold.

The cathode charge profile may be configured for decaying the second charge current according to a cathode step function. The cathode step function may include a plurality of step downs defined relative to a plurality of voltage values used to measure the voltage, optionally with each step down incrementally decreasing the second charge current relative to each of the step downs defined relative to a greater one of the voltage values.

The first charge profile may include a non-decaying configuration, and the cathode charge profile has an incrementally decaying configuration.

These features and advantages, along with other features and advantages of the present teachings, are readily apparent from the following detailed description of the modes for carrying out the present teachings when taken in connection with the accompanying drawings. It should be understood that even though the following figures and embodiments may be separately described, single features thereof may be combined to additional embodiments.

BRIEF DESCRIPTION OF THE DRAWINGS

The accompanying drawings, which are incorporated into and constitute a part of this specification, illustrate implementations of the disclosure and together with the description, serve to plain the principles of the disclosure.

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figures 1, 2:
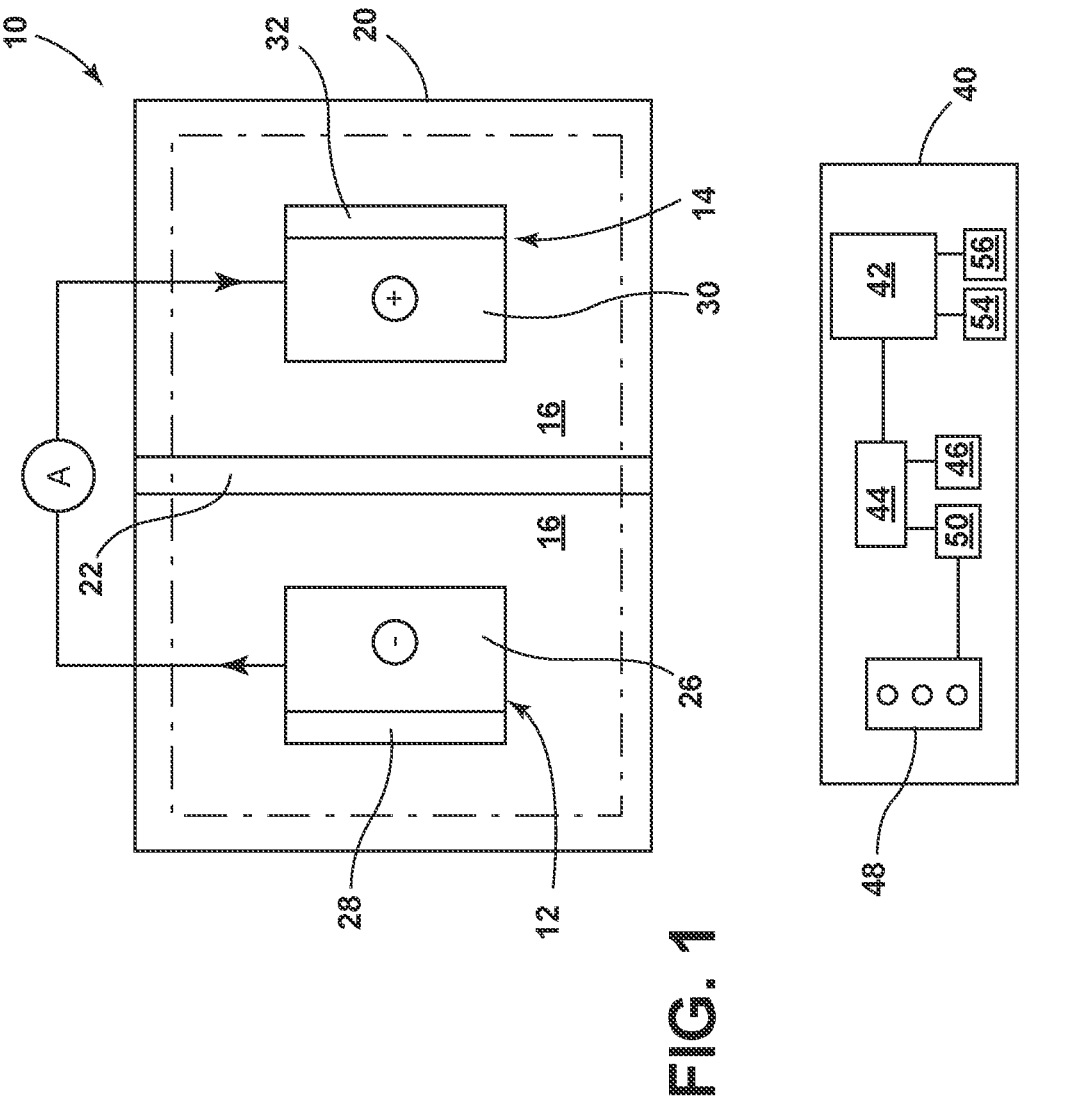
FIG. 1 illustrates a battery in accordance with one non-limiting aspect of the present disclosure.
FIG. 2 illustrates a schematic diagram of an electric vehicle in accordance with one non-limiting aspect of the present disclosure.

FIG. 1 illustrates a battery 10 in accordance with one non-limiting aspect of the present disclosure. While the present disclosure is not limited to lithium, lithium-ion, or other lithium based batteries, the battery 10 may predominately described as a lithium type of battery in order to be representative of a wide variety of batteries susceptible to plating, which in the case of lithium batteries may be referred to as lithium plating. The battery may include a negative electrode or anode 12, a positive electrode or cathode 14, an electrolyte 16 operatively disposed between the anode 12 and the cathode 14, and a separator 22. The anode 12, the cathode 14, and the electrolyte 16 may be encapsulated in a container 20, which may be a hard (e.g., metallic) case or soft (e.g., polymer) pouch, for example. The anode 12 and the cathode 14 may be situated on opposite sides of a separator 22. The separator 22 may comprise a microporous polymer or other suitable material capable of conducting lithium ions and optionally electrolyte (i.e., liquid electrolyte). For example, the electrolyte may comprise a polymer or a liquid electrolytic solution. The liquid electrolytes 16 may include $LiPF6$, $LiBF4$, and $LiClO4$, among others, dissolved in a non-aqueous solvent. Polymer electrolytes 16 may include one or more polymers, such as polyethyleneoxide (PEO) or polyacrylonitrile, among others, and one or more lithium salts, such as $LiPF6$, $LiBF4$, $LiClO4$, LiSICON, or LiPON, among others. The anode 12 may include a current collector 26 and a lithium intercalation host material 26 applied thereto. The cathode 14 may include a current collector 30 and a lithium-based active material 32 applied thereto. In one example, the anode 12 may comprise lithium and cathode 14 comprise sulfur. The active material 32 may store lithium ions at a higher electric potential than the intercalation host material 26. The current collectors 12 and 30 associated with the two electrodes 12, 14 may be electrically connected by an external circuit A (e.g., an interruptible circuit) that allows an electric current to pass between the electrodes 12, 14 to electrically balance the related migration of lithium ions. Although FIG. 1 illustrates the host material 26 and the active material 32 schematically for the sake of clarity, the host material 26 and the active material 32 may comprise an exclusive interface between the anode 12 and cathode 14, respectively, and electrolyte 16.

The host material 26 may include any lithium host material that may sufficiently undergo lithium ion intercalation, deintercalation, and alloying, while functioning as the negative terminal of the lithium ion battery 10. The host material 26 may also include a polymer binder material to structurally hold the lithium host material together. For example, in one embodiment, the host material 26 may include graphite intermingled in one or more of polyvinylidene fluoride (PVdF), an ethylene propylene diene monomer (EPDM) rubber, carboxymethoxyl cellulose (CMC), and styrene, 1,3-butadiene polymer (SBR). Graphite and carbon materials may be widely utilized to form the negative electrode because it may exhibit favorable lithium ion intercalation and deintercalation characteristics, is relatively non-reactive, and may store lithium ions in quantities that produce a relatively high energy density. Other materials may also be used to form the host material 26, for example, including one or more of lithium titanate, silicon, silicon oxide, tin, and tin oxide. The anode current collector 26 may include copper, aluminum, stainless steel, or any other appropriate electrically conductive material known to skilled artisans. The anode current collector 26 may be treated (e.g., coated) with highly electrically conductive materials, including one or more of conductive carbon black, graphite, carbon nanotubes, carbon nanofiber, graphene, and vapor growth carbon fiber (VGCF), among others.

The active material 32 may include any lithium-based active material that may sufficiently undergo lithium intercalation and deintercalation while functioning as the positive terminal of battery 10. The active material 32 may also include a polymer binder material to structurally hold the lithium-based active material together. One common class of known materials that may be used to form the active material 32 is layered lithium transitional metal oxides. For example, in various embodiments, active material 32 may comprise one or more of spinel lithium manganese oxide (LiMn2O4), lithium cobalt oxide (LiCoO2), a nickel-manganese-cobalt oxide [Li(NixMnyCoz)O2], or a lithium iron polyanion oxide such as lithium iron phosphate (LiFePO4) or lithium iron fluorophosphate (Li2FePO4F) intermingled in at least one of polyvinyldiene fluoride (PVdF), an ethylene propylene diene monomer (EPDM) rubber, carboxymethoxyl cellulose (CMC), and styrene, 1,3-butadiene polymer (SBR). Other lithium-based active materials may also be utilized besides those just mentioned. Those alternative materials may include, but are not limited to, lithium nickel oxide (LiNiO2), lithium aluminum manganese oxide (LixAlyMn1-yO2), and lithium vanadium oxide (LiV2O5), to name but a few. The cathode current collector 30 may include aluminum or any other appropriate electrically conductive material known to skilled artisans, and may be formed in a foil or grid shape. Cathode current collector 30 may be treated (e.g., coated) with highly electrically conductive materials, including one or more of conductive carbon black, graphite, carbon nanotubes, carbon nanofiber, graphene, and vapor growth carbon fiber (VGCF), among others.

The lithium-ion battery 10 is shown in singular form for non-limiting purposes as the present disclosure fully contemplates the battery 10 being including with a plurality of additional batteries, such as within a battery module or pack or otherwise part of a rechargeable energy storage system (RESS). The battery 10 may be connected in series and/or in parallel with the additional batteries, with the corresponding battery pack optionally being configured for reversibly supplying power and energy to an associated load device. Such lithium ion batteries 10 may also be used in various consumer electronic devices (e.g., laptop computers, cameras, and cellular/smart phones), military electronics (e.g., radios, mine detectors, and thermal weapons), aircrafts, and satellites, among others. Likewise, the lithium ion batteries, modules, and packs 10 may be incorporated in a vehicle such as a hybrid electric vehicle (HEV), a battery electric vehicle (BEV), a plug-in HEV, or an extended-range electric vehicle (EREV) to generate enough power and energy to operate one or more systems of the vehicle. For instance, the battery 10, modules, and packs may be used in combination with a gasoline or diesel internal combustion engine to propel the vehicle (such as in hybrid electric vehicles), or may be used alone to propel the vehicle (such as in battery powered vehicles).

FIG. 2 illustrates a schematic diagram of an electric vehicle 40 in accordance with one non-limiting aspect of the present disclosure. The vehicle 40 may include a battery pack 42 and related components, including a plurality of the batteries 10. The battery pack 42 may provide energy to a traction inverter 44 which converts the direct current (DC) battery voltage to a three-phase alternating current (AC) signal which is used by an electric drive motor 46 to propel the vehicle 40. An engine 48 may optionally be included to drive a generator 50, which in turn may provide energy to recharge the battery pack 42 via the inverter 44. External (e.g., grid) power may also be used to recharge the battery pack 42 via additional circuitry (not shown). Engine 48 may comprise a gasoline or diesel engine, for example. The battery 10 may operate by reversibly passing lithium ions between the anode 12 and the cathode 14. Lithium ions may move from the cathode 14 to the anode 12 while charging, and move from the anode 12 to the cathode 14 while discharging. The vehicle 40 may include a battery monitor 54 configured for monitoring the battery pack 42 and/or the individual batteries 10 therein and a battery charger 56 configured for controller the charging and discharging thereof, which may be include as or part of a battery monitoring system (BMS) or other type of battery control architecture.

Figure 3:
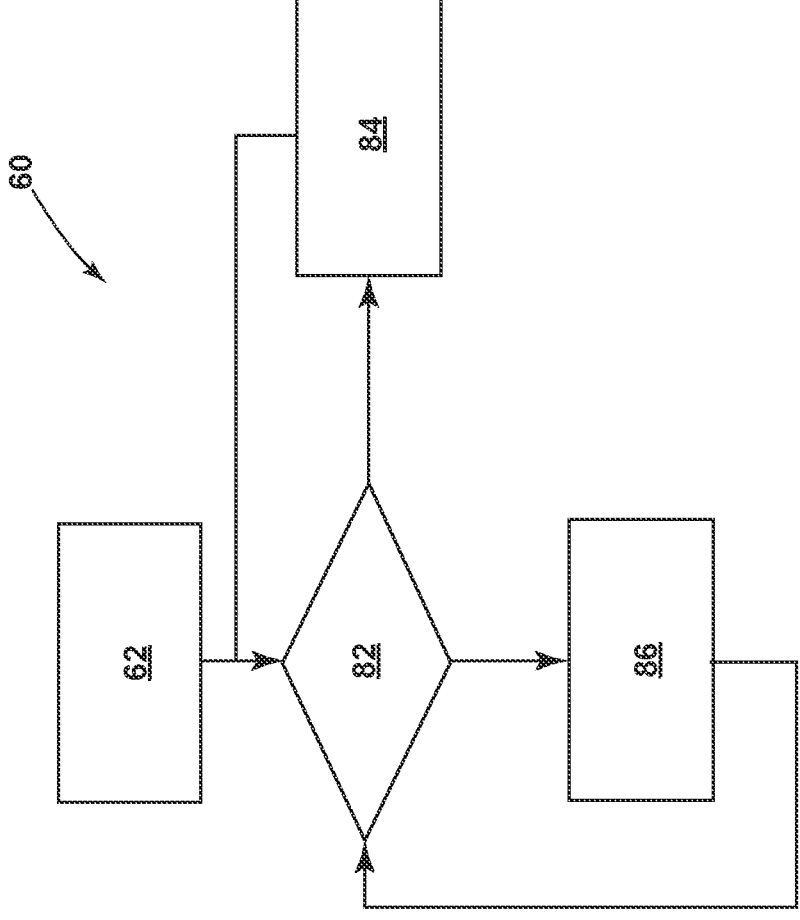
FIG. 3 illustrates a constant cathode potential method for minimizing or avoiding battery plating in accordance with one non-limiting aspect of the present disclosure.

As noted above, the present disclosure contemplates minimizing or avoiding plating for a wide variety of batteries, including but not necessarily limited to lithium type of batteries. The plating may generally correspond with buildup, metal depositing, coating, layering, or processing whereby additives may be plated, bonded, adhered, etc. to either one or both of the anode 12 and the cathode 14, and in some cases more specifically to the current collectors 12, 30, the host material 26, and/or active material 32 associated therewith. The predominant use of lithium plating herein, accordingly, is not intended to be limiting and rather to be full encompassing of the wide variety of plating that may be minimized or avoided in accordance with the methods, processes, systems, etc. described herein. To that end, FIG. 3 illustrates a constant cathode potential method 60 for minimizing or avoiding battery plating in accordance with one non-limiting aspect of the present disclosure. The method 60 may be useful in minimizing or avoiding the above-described lithium plating for the cathode 14. As described below in more detail, the method 60 may be helpful in thwarting lithium plating by selectively controlling charging of the battery relative to plating related parameters determined for the cathode 14.

The constant cathode potential method 60 may be configured for minimizing or avoiding lithium plating of the battery 10 by adjusting the charging thereof as a function of plating characteristics derived based on properties of the cathode 14. The constant cathode potential method may be advantageous in avoiding or thwarting lithium plating in circumstances where lithium plating of the anode 12 may be unlikely due to the anode 12 having properties that may limit lithium plating without having to adjust charging currents, e.g., the anode, or the current collector 26 and/or host material 26 associated therewith, may be robustly manufactured such that the lithium plating thereof may be relatively inconsequential under relevant or normal charging conditions. The present disclosure, for example, contemplates leveraging advances made in the construction, manufacturing, etc. of anodes, such as the above described anode 12, whereby the lithium plating thereof may be relatively insignificant compared to the potential for lithium plating of the cathode 14, or the current collector 30 or the active material 32 associated therewith. In other words, advances in construction of the anode 12 may result in the lithium plating of the cathode 14 being more relevant to maintaining desirable operability of the battery 10 than the potential of lithium plating to the anode 12, i.e., the cathode 14 may be more susceptible to lithium plating.

Figures 4, 5:
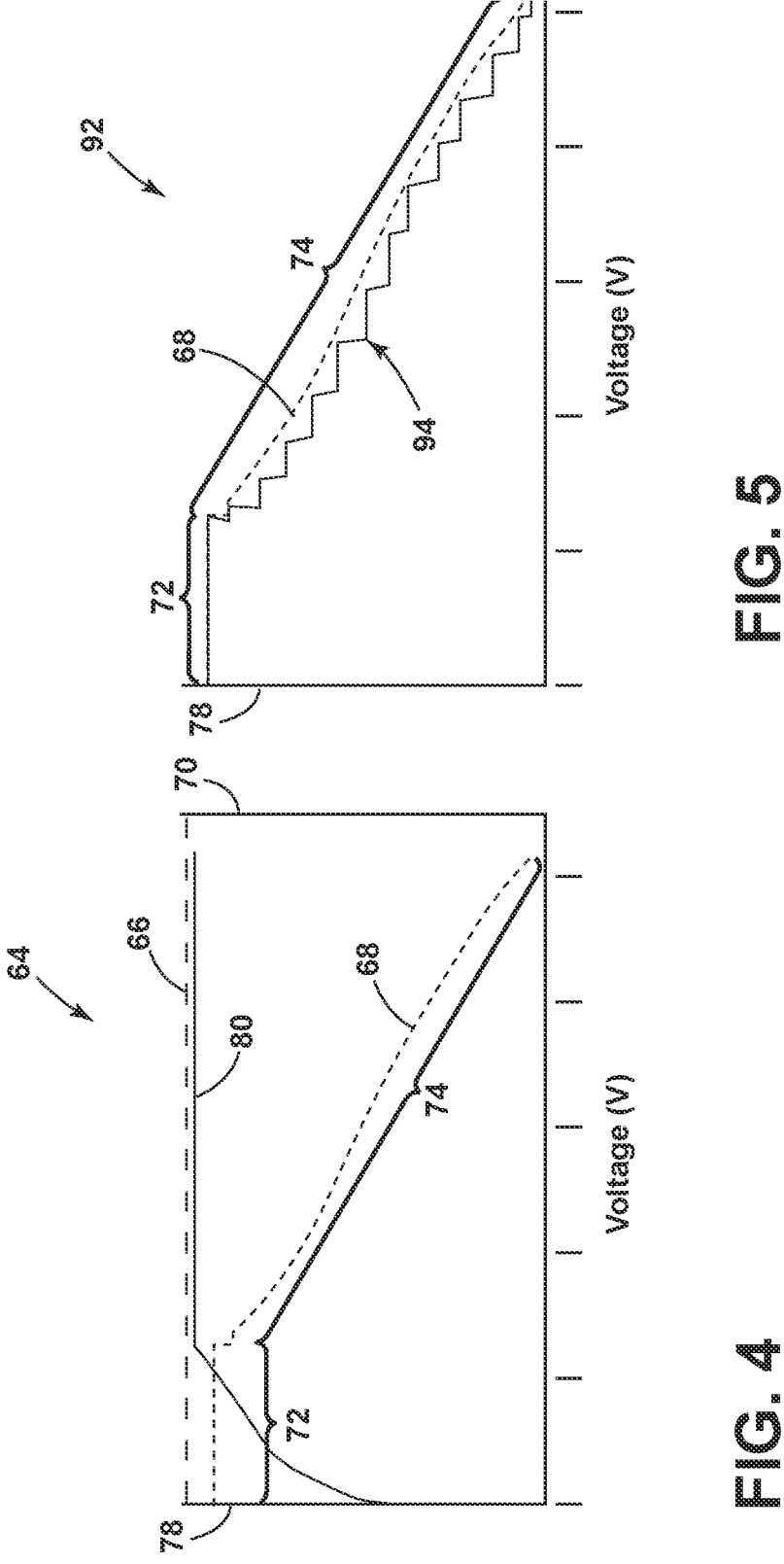
FIG. 4 illustrates a constant cathode potential charging profile in accordance with one non-limiting aspect of the present disclosure.
FIG. 5 illustrates a cathode step function in accordance with one non-limiting aspect of the present disclosure.

Block 62 relates to an initial charging process for initiating charging of the battery 10 in what may be referred to as a first charging phase, which may include providing electrical power to the battery 10 from the generator 50, another source onboard vehicle 40, and/or from a source offboard the vehicle 40, e.g., another vehicle or a charging station. The first charging phase may correspond with the battery charger 56 determining a constant cathode potential charging profile 64 for the battery 10. FIG. 4 illustrates such a constant cathode potential charging profile 64 in accordance with one non-limiting aspect of the present disclosure. The constant cathode potential charging profile 64 may be determined from operating characteristics of the cathode 14, empirical testing, battery monitoring over time, etc. The constant cathode potential charging profile 64 may be represented in the illustrated manner with respect to a cathode threshold 66 and a battery charge current 68, with each being defined relative to a state of charge (SOC) of the battery 10. The cathode threshold 66 may be selected based on properties of the cathode 14 associated with lithium plating to represent a maximum voltage potential desired for the cathode 14 during charging. The cathode 14 may potentially experience lithium plating should the battery 10 be charged in a manner that results in the charging occurring while a cathode voltage potential is above the cathode threshold for an undesirable period of time. A vertical axis 70 delineating voltages for the charge threshold is shown without individual voltage values due to the attendant values widely varying depending on the type of cathode 14.

The battery charge current 68 may represent current provided to the battery 10 for charging. The battery charge current 68 may include a first charge profile 72 associated with current provided to the battery 10 prior to the cathode voltage potential approaching the cathode threshold 66 and a second charge profile 74 associated with current provided to the battery 10 thereafter, with the second charge profile 74 optionally being configured for preventing the cathode voltage potential from exceeding the cathode threshold 66 as the battery 10 is charged. A vertical axis 78 delineating current for the charge current 68 is also shown without individual values due to the attendant values widely varying depending on the type of cathode 14. The first and second charge current profiles 72, 74 are shown for non-limiting purposes as illustrative of current adjustments that may be made throughout the charging process, or more specifically, alterations that may be made as the cathode voltage potential approaches the cathode threshold 66, e.g., when the cathode voltage potential is within a predefined range of the cathode threshold 66. Once this predefined range is reached, the charging current 68 may switch from the first charge current profile 72 to the second charge current profile 74, which may be characterized as commencing a second charging phase.

The constant cathode potential charging profile 64 is shown for non-limiting purposes with respect to the cathode threshold 66 and the charging current 68 being defined relative to the voltage of the battery 10, which may be measured at the cathode of each battery 10 and at a pack level by measuring the cathode of the battery pack 42. The use of other values besides voltage to delineate adjustments to the charging current 68 and intervals where the cathode voltage potential may be approaching the cathode threshold 66 is fully contemplated, e.g., battery SOC could be used. One non-limiting aspect of the present disclosure, for example, contemplates the battery monitor 54 include capabilities for measuring other values that may be used in cooperation in place of or in addition to voltage to facilitate delineating the charging current profiles and the cathode threshold. One such value may correspond with directly measuring a voltage potential of the cathode 14, such as with a sensor attached thereto and/or through calculations made based on other metrics available to the battery monitor 54, e.g., metrics derived from the battery pack 42 may be used to estimate the voltage potential at the cathode 14 of individual batteries 10. While triggering or otherwise changing profiles for the charging current 68 may be based on measurable events, other mechanisms besides voltage and measured cathode voltage potential, such as learning algorithms, may be employed without deviating from the scope and contemplation of the present disclosure.

Returning to FIG. 3, Block 82 relates to a cathode monitoring process whereby charging of the battery 10 is monitored, such as with the battery monitor 54, to determine whether the cathode 14 may be being driven to a level where lithium plating may arise. This may include, for example, the battery monitor 54 monitoring the battery charging to determine whether a voltage potential 80 of the cathode 14 is approaching the cathode threshold 66. The monitoring may include assessing a voltage potential at the cathode 14 and/or at an equivalent electrode of the battery pack 42, calculating a voltage of the battery 10 and/or battery pack 42, or processing of the values used for the plating characteristics derived based on properties of the cathode 14. One non-limiting aspect of the present disclosure contemplates the monitoring process being configured for determining when the battery charge current 68 being supplied to the battery 10 may need to be reduced in order to minimize or avoid conditions associated with the same plating of the cathode 14. FIG. 4 illustrates an exemplary situation whereby the battery charging current 68 may be approaching the cathode threshold at approximately 25% of the maximum voltage, however, this value may vary depending on construction of the battery 10, temperature, aging, and other characteristics. Block 84 relates to continuing charging of the battery 10 according to the battery charge current set in Block 62 in the event Block 82 fails to determine the battery charging to be approaching the cathode threshold 66.

Block 86 relates to a secondary charging process for continuing charging of the battery 10 after making an adjustment to the battery charge current 68 utilized in Block 62. The secondary charging process may commence the above-referenced secondary charging phase whereby battery charge current 68 is adjusted from the first charge profile 72 to the second charge profile 74. As shown in FIG. 4, the second charge profile 74 may correspond with a decaying type will profile whereby the battery charge current 68 may be incrementally decreased as the battery voltage increases. This decaying configuration of the second charge profile 74 may be differentiated from the constant, non-decaying, or consistent configuration of the first charge profile 72. While the second charge profile 74 is shown to successively decrease as the battery charge level increases, the present disclosure fully contemplates the second charge profile 74 having other configurations, including configurations whereby the second charge profile 74 may temporarily increase the battery charge current 68 and/or make real-time adjustments in order to control the cathode charge potential to be as close to the cathode threshold 66 as possible without exceeding the cathode threshold 66, e.g., to continuously maximize the battery charge current 68 without exceeding the cathode threshold 66. The granularity or precision at which alterations may be made to the battery charge current 68 may vary depending on capabilities of the battery 10, the battery pack 42, and/or the battery charger 56.

FIG. 5 illustrates a cathode step function 82 for adjusting of the charge current 68 according to the second charge profile 74 in accordance with one non-limiting aspect of the present disclosure. The cathode step function 82 may include a plurality of step downs, which may correspond with a plurality of plateaus (not individually labeled) of a stepped line 94. The steps downs may be defined relative to a plurality of voltage values used to measure the voltage, or optionally according to other metrics and values used to control battery charging, e.g., cathode potential values, etc. Each step down may be used for incrementally decreasing the charge current 68 relative to each of the step downs defined relative to a greater one of the voltage values. The step downs may correspond with incremental decreases in the battery charge current 68 that may be used in place of more precise or granular adjustments, i.e., rather than the smooth shape of the second charge profile 74, the step downs may provide less precise or granular adjustments to the battery charging current 68. The cathode step function 92, for example, may be implemented in the illustrated manner at a pack level whereby the battery charger 56 may be configured for stepping down the battery charge current 68 being supplied to the battery pack 42, which may then in turn step down the battery charge current 68 individually provided to each of the batteries 10 included therein.

Figure 6:
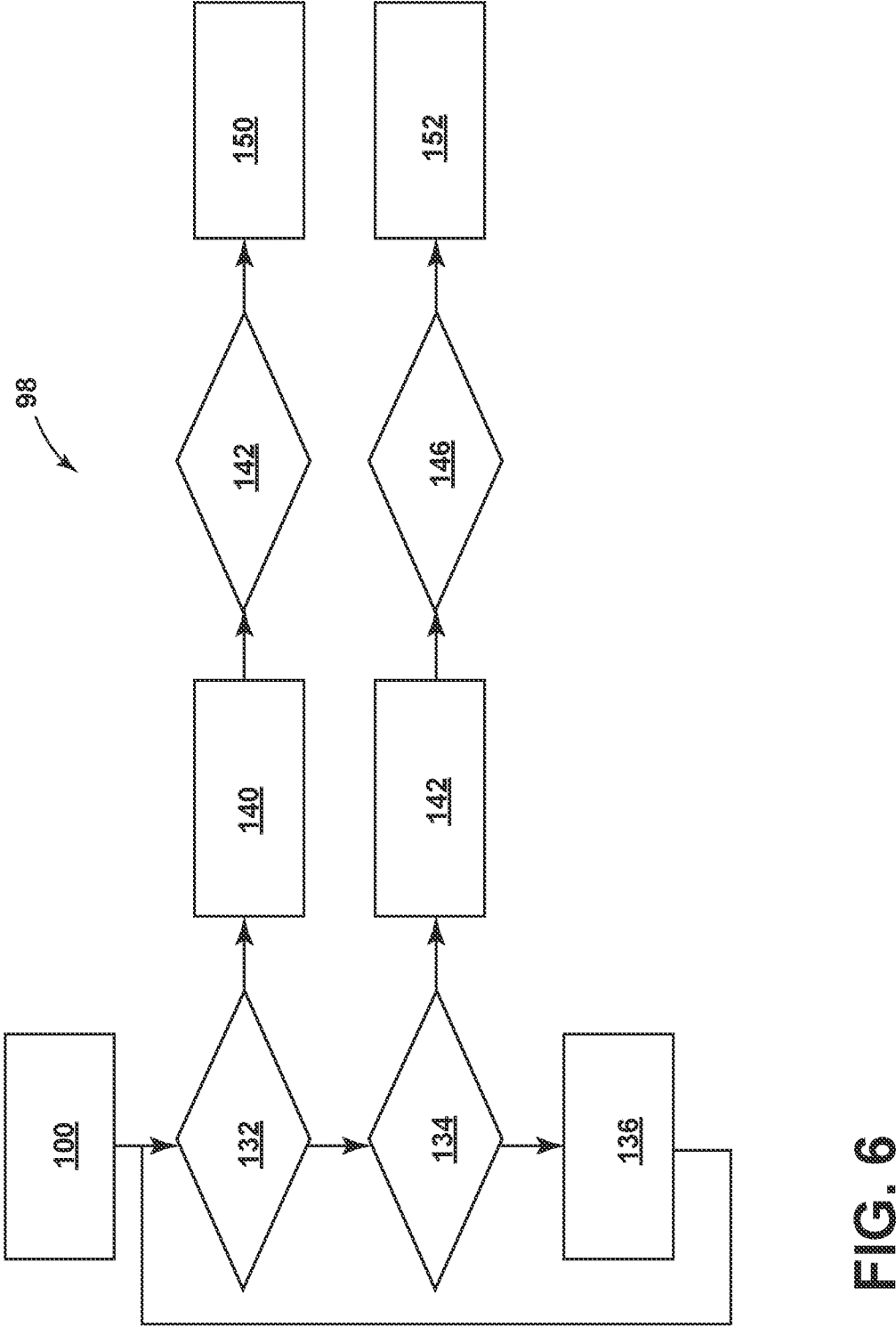
FIG. 6 illustrates a combined constant potential method for minimizing or avoiding battery plating in accordance with one non-limiting aspect of the present disclosure.

The constant cathode potential method 60 may be utilized in this manner to minimize or avoid lithium plating of the cathode 14. As noted above, the constant cathode potential method 60 may be premised on a lack of need for correspondingly limiting or otherwise adjusting the battery charging to account for conditions associated with plating the anode 12. This capability to control charging of the battery 10 based on plating parameters for the cathode 14 may be less complex and require less processing than accounting for plating characteristics of the anode 12. The present disclosure, however, contemplates scenarios whereby the constant cathode potential method 60 may be leveraged to also assist with minimizing or avoiding plating of the anode 12. To that end, FIG. 6 illustrates a combined constant potential method 98 for minimizing or avoiding battery plating in accordance with one non-limiting aspect of the present disclosure. The method 98 may be useful in minimizing or avoiding the above-described lithium plating for both of the anode 12 and the cathode 14. As described below in more detail, the method 98 may be helpful in thwarting lithium plating by selectively controlling charging of the battery 10 relative to plating related parameters determined for the anode 12 and the cathode 14.

Figures 7, 8, 9, 10:
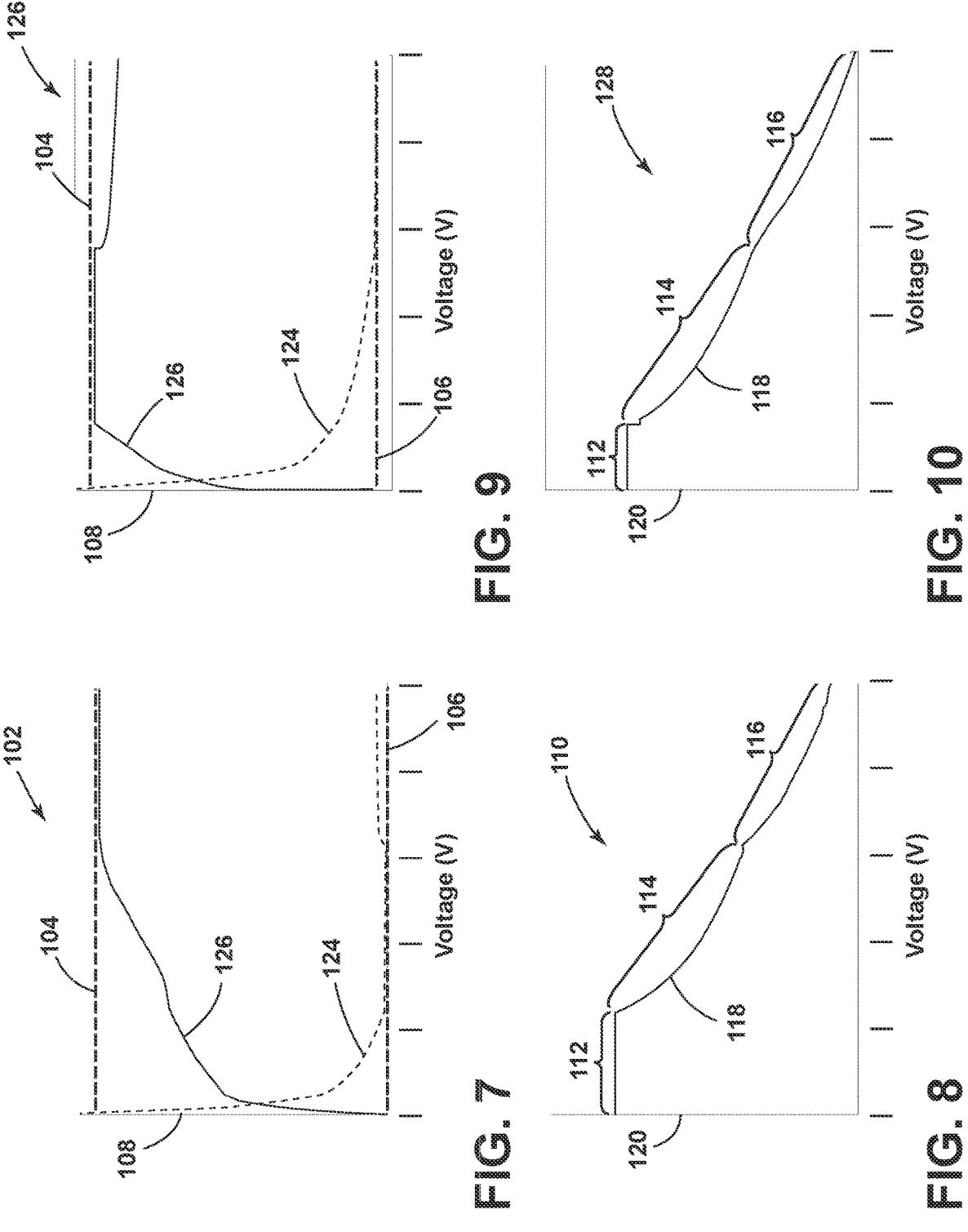
FIG. 7 illustrates a constant anode-cathode potential charging profile in accordance with one non-limiting aspect of the present disclosure.
FIG. 8 illustrates an anode-cathode charge current profile in accordance with one non-limiting aspect of the present disclosure.
FIG. 9 illustrates a cathode-anode potential charging profile in accordance with one non-limiting aspect of the present disclosure.
FIG. 10 illustrates a cathode-anode charge current profile in accordance with one non-limiting aspect of the present disclosure.

The combined constant potential method 98 may be configured for minimizing or avoiding lithium plating of the battery 10 by adjusting the charging thereof as a function of plating characteristics derived based on properties of both the anode 12 and the cathode 14. Block 100 relates to an initial charging process for initiating charging of the battery 10 in what may be referred to as a first charging phase, which may be similar to that described above in Block 62. The first charging phase may correspond with the battery charger 56 determining a constant anode-cathode potential charging profile 102 for the battery 10. FIG. 7 illustrates such a constant anode-cathode potential charging profile 102 in accordance with one non-limiting aspect of the present disclosure. The constant anode-cathode potential charging profile 102 may be determined from operating characteristics of the anode 12, the cathode 14, empirical testing, battery monitoring over time, etc. The constant cathode potential charging profile 102 may be represented in the illustrated manner with respect to a cathode threshold 104 and an anode threshold 106, with each being defined relative to the voltage of the battery 10.

The cathode threshold 104 may be similar to that described above. The anode threshold 106 may be based on properties of the anode 12 associated with lithium plating, i.e. to represent a minimum voltage potential desired for the anode 12 during charging. The anode 12 may potentially experience lithium plating should the battery 10 be charged in a manner that results in the charging occurring while the anode voltage potential is below the anode threshold 106 for an undesirable period of time. A vertical axis 108 delineating voltages for the cathode and anode charge thresholds 104, 106 is shown without individual voltage values due to the attendant values widely varying depending on the type of anode 12 and cathode 14. FIG. 8 illustrates a cathode-anode current profile 110 in accordance with one non-limiting aspect of the present disclosure. The anode-cathode charge current profile 110 may be used to define a plurality of charge profiles 112, 114, 116 for a battery charging current 118 operable for minimizing or avoiding lithium plating of anode 12 in the cathode 14 when being charged according to the constant cathode-anode potential profile 102 shown in FIG. 7. A vertical axis 120 delineating current for the charge current is shown without individual values due to the attendant values widely varying depending on the type of anode 12 and cathode 14.

The anode-cathode charge current profile 110 is shown for non-limiting purposes as illustrative of current adjustments that may be made throughout the charging process, or more specifically, alterations that may be made as anode and/or cathode voltage potentials 124, 126 respectively approach the cathode and anode thresholds 104, 106, e.g., when the anode voltage potential 124 is within a predefined range of the anode threshold 106 and/or the cathode voltage potential 126 is within a predefined range of the cathode threshold 104. Once this predefined range is reached, the charging current 118 may switch from the first charge current profile 112 to one or more additional charge profiles 114, 116. The constant anode-cathode potential charging profile 102 is shown for non-limiting purposes with respect to the cathode and anode thresholds 104, 106 and the charging current 118 being defined relative to the voltage, however, as noted above, other metrics may be utilized. FIG. 7 illustrates an exemplary scenario whereby the anode voltage potential 124 during charging approaches the anode threshold 106 prior to the cathode voltage potential 126 approaching the cathode threshold 104. In this scenario, the anode-cathode charge current profile 110 shown in FIG. 8 may include the first charge profile 112 whereby a constant and non-decaying battery charge current, or first charging current, being provided to the battery 10 whereafter a second charge current profile 114, or anode charge profile, may be implemented to avoid the anode potential 124 exceeding the anode threshold 106. Thereafter a third charge current profile 116, which may be a combined anode-cathode charge profile, may be implemented to avoid the cathode voltage potential 126 from exceeding the cathode threshold. The second and third charge profiles 114, 116 are shown to be incrementally decaying profiles, with the third charge profile 116 having a greater rate of decay than the second charge profile 114.

FIG. 9 illustrates such a constant cathode-anode potential charging profile 126 in accordance with one non-limiting aspect of the present disclosure. FIG. 9 illustrates an exemplary scenario whereby the cathode voltage potential 126 approaches the cathode threshold 104 during charging prior to the anode voltage potential 124 approaching the anode threshold 106. In this scenario, a cathode-anode charge current profile 128 shown in FIG. 10 may be used and include a first charge profile 112 whereby a constant and non-decaying battery charge current, or first charging current, being provided to the battery 10 whereafter a second charge current profile 114, or cathode charge profile, may be implemented to avoid the cathode potential 126 from exceeding the cathode threshold 104. Thereafter a third charge current profile 116, which may be a combined cathode-anode charge profile, may be implemented to avoid the anode potential 124 from exceeding the anode threshold 106. The second and third charge profiles 114, 116 are shown to be incrementally decaying profiles, with the third charge profile 116 having a greater rate of decay than the second charge profile 114. Returning to FIG. 6, Block 132 relates to a cathode monitoring process whereby charging of the battery 10 is monitored, such as with the battery monitor 54, to determine whether the cathode 14 may be being driven to a level where lithium plating may arise. Block 134 relates to an anode monitoring process whereby charging of the battery 10 is monitored, such as with the battery monitor 54, to determine whether the anode 12 may be being driven to a level where lithium plating may arise. Block 136 relates to continuing charging of the battery 10 according to the battery charge current 118 set in Block 100 in the event Blocks 132, 134 fail to determine the battery charging causing either of the cathode potential 26 and the anode potential 124 to approach the cathode or anode thresholds 104, 106.

Blocks 140, 142 relate to a secondary charging process for continuing charging of the battery 10 after making an adjustment to the battery charge current 118 utilized in Block 100. The secondary charging process may commence in Block 144 in response to the cathode voltage potential 126 approaching the cathode threshold 104 before the anode voltage potential 124 approaches the anode threshold 106 (e.g., FIGS. 7 and 8) and in Block 146 in response to the anode voltage potential 124 approaching the anode threshold 106 before the cathode voltage potential 126 approaches the cathode threshold 104 (e.g., FIGS. 9 and 10). Blocks 150, 152 relate to a tertiary charging process for continuing charging of the battery 10 after making the adjustment and one of Blocks 144, 146. The tertiary charging process may commence in Block 150 in response to the anode voltage potential 124 approaching the anode threshold 106 (e.g., FIG. 7) and in Block 152 in response to the cathode voltage potential 126 approaching the cathode threshold 104 (e.g., FIG. 8). While the combined constant cathode-anode potential method 98 is described with respect to including the first, second, and third charge current profiles 112, 114, 116, the present disclosure fully contemplates including additional charge current profiles and/or profiles having other shapes and configurations, including profile that may include increases and/or decreases in charge current.

As supported above, the present disclosure relates to a charge method and fast charge strategy based on constant cathode potential, and optionally anode potential. The contemplated control may be based on a constant cathode potential phase of charging for the usual constant cell potential phase. This allows precise control of cathode potential, which may be particularly important for high-energy (high-nickel content) cathodes that are more susceptible to damage and thermal runaway as a result of over-charge. The charge method may include a first phase of max current charge, a second phase of cathode constant potential charge, and a third phase of constant cell potential phase. In the case with a reference electrode in a battery cell, the cathode constant potential charge current may be controlled through direct feedback control of cathode versus reference potential. In the case that no reference electrode may be present in a cell, a cathode constant potential charge current curve may be determined with prior testing. A determination of cathode constant potential charge current curve may include a cathode potential limit selection, current curve generation by cathode constant potential charge experiment, charge profile scaling, and/or modification based on the experimental profile. The cathode potential limit may be determined at its maximum available potential without showing limitations that may impact cell performance. This potential may be determined by cyclic voltammetry test, capacity or columbic efficiency analysis, or material analysis. A charge protocol may be selected on the basis of voltage and temperature at the start of charge according to which electrode may be expected to be the limiting factor. This selection may be updated in real time during the charge based on electrode potential feedback if a reference electrode is available in the cell or can be defined by a lookup table that is calibrated in advance based laboratory experiments with the same cell design. In some case, the battery may be heated up or cooled down to certain temperature to be ready to charge with a constant cathode potential protocol.

The terms "comprising", "including", and "having" are inclusive and therefore specify the presence of stated features, steps, operations, elements, or components, but do not preclude the presence or addition of one or more other features, steps, operations, elements, or components. Orders of steps, processes, and operations may be altered when possible, and additional or alternative steps may be employed. As used in this specification, the term "or" includes any one and all combinations of the associated listed items. The term "any of" is understood to include any possible combination of referenced items, including "any one of" the referenced items. "A", "an", "the", "at least one", and "one or more" are used interchangeably to indicate that at least one of the items is present. A plurality of such items may be present unless the context clearly indicates otherwise. All values of parameters (e.g., of quantities or conditions), unless otherwise indicated expressly or clearly in view of the context, including the appended claims, are to be understood as being modified in all instances by the term "about" whether or not "about" actually appears before the value. A component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function.

While various embodiments have been described, the description is intended to be exemplary, rather than limiting and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims. Although several modes for carrying out the many aspects of the present teachings have been described in detail, those familiar with the art to which these teachings relate will recognize various alternative aspects for practicing the present teachings that are within the scope of the appended claims. It is intended that all matter contained in the above description or shown in the accompanying drawings shall be interpreted as illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

What is claimed is:

1. A method for minimizing or avoiding lithium plating when direct current (DC) fast charging a battery included in a vehicle, comprising:

charging the battery during a first charging phase with a first charge current having a first charge profile, wherein the first charge profile is associated with the first charge current being provided to the battery prior to a cathode voltage potential approaching a cathode threshold; and commencing a second charging phase for charging the battery with a second charge current having a cathode charge profile, the cathode charge profile configured to prevent the cathode voltage potential from exceeding the cathode threshold by incrementally decaying the second charge current to prevent the cathode voltage potential of a cathode of the battery from exceeding the cathode threshold.

2. The method according to claim 1, further comprising:

commencing a third charging phase for charging the battery with a third charge current having an anode charge profile, the anode charge profile incrementally decaying the third charge current to prevent an anode potential of an anode of the battery from exceeding an anode threshold.

3. The method according to claim 2, further comprising:

commencing the second charging phase after the first charging phase and prior to the third charging phase.

4. The method according to claim 3, further comprising:

the first charge profile consistently maintaining the first charge current in a non-decaying manner;

the cathode charge profile incrementally decaying the second charge current at a first decaying rate; and the anode charge profile incrementally decaying the third charge current at a second decaying rate greater than the first decaying rate.

5. The method according to claim 2, further comprising:

commencing the second charging phase after the first charging phase and after the third charging phase.

6. The method according to claim 5, further comprising:

the first charge profile consistently maintaining the first charge current in a non-decaying manner;

the anode charge profile incrementally decaying the second charge current at a first decaying rate; and the cathode charge profile incrementally decaying the third charge current at a second decaying rate greater than the first decaying rate.

7. The method according to claim 2, further comprising:

monitoring the cathode potential; and commencing the second charging phase in response to the cathode potential being within a predefined cathode range of the cathode threshold.

8. The method according to claim 7, further comprising:

monitoring the anode potential; and commencing the third charging phase in response to the anode potential being within a predefined anode range of the anode threshold.

9. The method according to claim 2, further comprising:

monitoring a state of charge (SOC) of the battery; and commencing the second charging phase in response to the SOC exceeding a cathode SOC threshold.

10. The method according to claim 9, further comprising:

monitoring a state of charge (SOC) of the battery; and commencing the third charging phase in response to the SOC exceeding an anode SOC threshold.

\* \* \* \* \*